(12) United States Patent
Saito

(10) Patent No.: US 7,485,413 B2
(45) Date of Patent: *Feb. 3, 2009

(54) PHOTOSENSITIVE COMPOSITION AND METHOD FOR FORMING PATTERN USING SAME

(75) Inventor: Satoshi Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/751,762

(22) Filed: May 22, 2007

(65) Prior Publication Data
US 2007/0224550 A1 Sep. 27, 2007

Related U.S. Application Data

(63) Continuation of application No. 11/149,209, filed on Jun. 10, 2005, now Pat. No. 7,241,554.

(30) Foreign Application Priority Data
Jun. 11, 2004 (JP) ............................. 2004-174176

(51) Int. Cl.
G03F 7/30 (2006.01)
(52) U.S. Cl. ............... 430/326; 430/270.1; 430/330; 430/905; 430/910
(58) Field of Classification Search .............. 430/326, 430/330, 270.1, 905, 910
See application file for complete search history.

(56) References Cited

U.S. PATENT DOCUMENTS

| | | | |
|---|---|---|---|
| 3,515,552 A | 6/1970 | Smith | 430/199 |
| 3,536,489 A | 10/1970 | Smith | 430/253 |
| 5,348,838 A | 9/1994 | Ushirogouchi et al. | 430/270.1 |
| 6,280,897 B1 | 8/2001 | Asakawa et al. | 430/270.1 |
| 6,844,131 B2 | 1/2005 | Oberlander et al. | 430/270.1 |
| 7,241,554 B2 * | 7/2007 | Saito | 430/270.1 |
| 7,402,712 B2 * | 7/2008 | Hatakeyama et al. | 568/665 |

FOREIGN PATENT DOCUMENTS

| | | |
|---|---|---|
| JP | 9-221526 | 8/1997 |
| JP | 2000-298344 | 10/2000 |
| JP | 2002-341538 | 11/2002 |
| JP | 2003-295444 | 10/2003 |
| JP | 2003-345023 | 12/2003 |
| JP | 2004-333548 | 11/2004 |
| JP | 2004-333549 | 11/2004 |
| JP | 2005-220059 | 8/2005 |

OTHER PUBLICATIONS

Takuma Hojo, et al., "Recent Progress in New Acetal-based Resist for Electron Beam Lithography", Journal of Photopolymer Science and Technolgoy, vol. 16, No. 3, 2003, pp. 455-458.

* cited by examiner

Primary Examiner—John S Chu
(74) Attorney, Agent, or Firm—Oblon, Spivak, McClelland, Maier & Neustadt, P.C.

(57) ABSTRACT

The photosensitive composition of the invention contains a polymer material having a group having a structure represented by following general formula (2), and a photo acid generator generating acid with an ultraviolet ray or an ionizing radiation

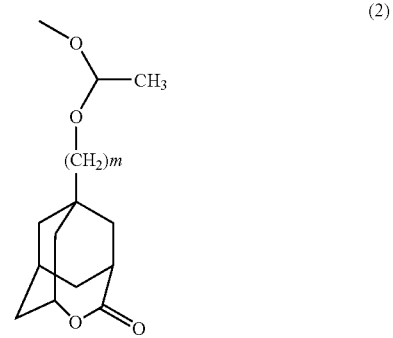

(2)

wherein m represents an integer of 0 or more.

3 Claims, No Drawings

PHOTOSENSITIVE COMPOSITION AND METHOD FOR FORMING PATTERN USING SAME

CROSS-REFERENCE TO RELATED APPLICATIONS

This application is based upon and claims the benefit of priority from the prior Japanese Patent Application No. 2004-174176, filed on Jun. 11, 2004, the entire contents of which are incorporated herein by reference.

BACKGROUND OF THE INVENTION

1. Field of the Invention

The present invention relates to a photosensitive composition and a method for forming a pattern using the same.

2. Description of the Related Art

A photoresist has been used in the industrial field of electronic devices requiring various kinds of minute processing, such as a semiconductor integrated circuit including an LSI. As an exposing apparatus used for forming a pattern of the photoresist, a reduced projection mask aligner, which is generally referred to as a stepper, has been used. Examples of a light source used in the apparatus include the g line (wavelength: 436 nm), the h line (405 nm) and the i line (365 nm) of a mercury lamp, and KrF (248 nm), ArF (193 nm) and F2 (157 nm) as an excimer laser. Exposure with an electron beam and an ion beam also attains high resolution processing owing to the short wavelength thereof and can directly form a pattern. Therefore, electron beam lithography is considered as being important, and a resist capable of being used therefore is demanded.

According to the progress in degree of integration of semiconductor integrated circuit in recent years, the necessity of the formation of fine patterns is being increased, in which the electron beam lithography technique, and a resist material and a process technique capable of being used therefore are indispensable.

One of the problems in the electron beam lithography is that the throughput is inferior to the lithography technique using a stepper. While improvement of the apparatus including the exposure system are necessary for improving the throughput, improvement of the sensitivity of the photoresist is also an important factor. As simple mathematics, the throughput can be improved twice if the sensitivity is increased twice.

The electron beam lithography involves a problem in contamination of an EB column upon EB writing a resist due to a vacuum system included in the apparatus. This is because of the following reasons. In recent years, a material referred to as a chemical amplification type is used as a photoresist for the electron beam lithography from the standpoint of sensitivity. The material, in the case of a positive type, has an alkali soluble group, such as a hydroxyl group, protected with a substituent capable of being decomposed with an acid. As the substituent in the conventional resist materials, a tert-butoxycarbonyl group, a tert-butyl group, a trimethylsilyl group, an ethoxyethyl group and the like have been used. These protecting groups are released and vaporized into vacuum with an acid generated upon EB writing even in a room temperature atmosphere in the EB column. The hydrocarbon thus formed deteriorates the vacuum in the mirror tower to cause failures in the exposure system.

Furthermore, photoresists used in photolithography of the next generations necessarily have a smaller thickness for avoiding a problem in incident distance of incident electrons, a problem in resolution, and particularly, collapse of patterns. There is such a problem, associated therewith, that the etching selectivity is difficult to ensure in the subsequent processing step of a substrate, and thus a photoresist, which has an alicyclic protecting group, improved with etching resistance has been proposed (for example, in *J. Photopolym. Sci. & Technol.*, vol. 16, No. 3, p. 455-458 (2003)).

BRIEF SUMMARY OF THE INVENTION

The photoresist which has the alicyclic protecting group tend to has problems in phase separation after coating, increase in edge roughness, and decrease in sensitivity. Furthermore, the photoresist involves such a problem that it cannot be adapted to various-alkaline-concentrations developer.

Under the circumstances an object of the invention is to provide such a photosensitive composition that can suppress contamination of a mirror tower, has high etching resistance, can solve the problems in edge roughness, and can be adapted to developer solutions having various alkali concentrations, and to provide a method for forming a pattern using the photosensitive composition.

According to a first aspect of the invention, a photosensitive composition includes: a polymer material having a group having a structure represented by following general formula (1); and a photo acid generator generating acid with at least one of an ultraviolet ray and an ionizing radiation,

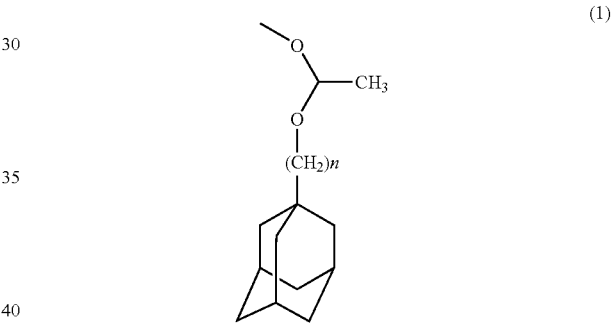

(1)

wherein n represents an integer of 1 or more.

According to a second aspect of the invention, a photosensitive composition includes: a polymer material having a group having a structure represented by following general formula (2); and a photo acid generator generating an acid with at least one of an ultraviolet ray and an ionizing radiation,

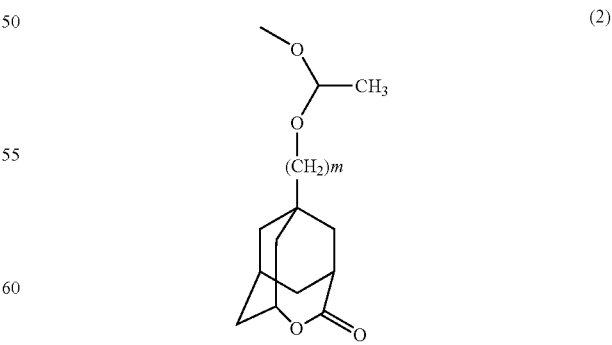

(2)

wherein m represents an integer of 0 or more.

According to a third aspect of the invention, a photosensitive composition includes: a polymer material having a group having a structure represented by following general formula (3); and a photo acid generator generating acid with at least one of an ultraviolet ray and an ionizing radiation,

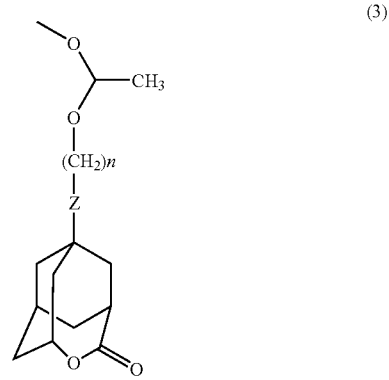
(3)

wherein n represents an integer of 1 or more, and Z represents one of groups represented by the following chemical formula (1)

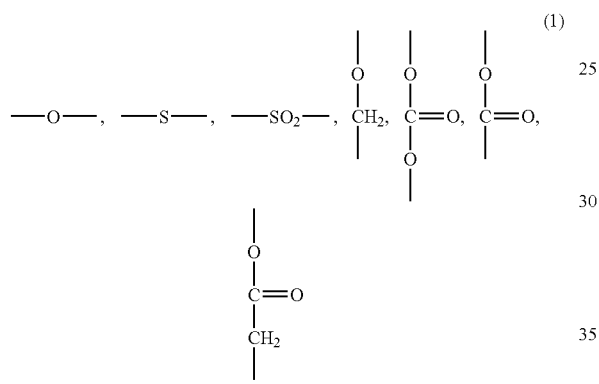
(1)

According to a fourth aspect of the invention, a method for forming a pattern, includes: forming a photosensitive layer comprising photosensitive composition on a substrate, selectively irradiating the photosensitive layer with at least one of an ultraviolet ray and an ionizing radiation; subjecting the substrate to a heat treatment; and developing the photosensitive layer to remove selectively an irradiated area of the photosensitive layer after the heat treatment. The photosensitive composition includes: a polymer material having a group having a structure represented by following general formula (2); and a photo acid generator generating an acid with at least one of an ultraviolet ray and an ionizing radiation,

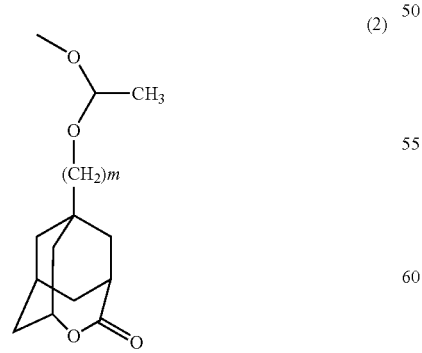
(2)

wherein m represents an integer of 0 or more; [0023]

According to the invention, such a photosensitive composition can be provided that can suppress contamination of an EB column, has high etching resistance, can solve the problems in edge roughness, and can be adapted to developer solutions having various alkali concentrations, and to provide a method for forming a pattern using the photosensitive composition.

DETAILED DESCRIPTION OF THE INVENTION

The invention will be described in detail with reference to embodiments.

A photosensitive composition of an embodiment of the invention contains a resin component and an acid generator, and the resin composition is an alkali soluble resin having an alkali soluble group, a part or the entire of which is protected with at least one of alicyclic acetal groups represented by the general formulae (1) to (3).

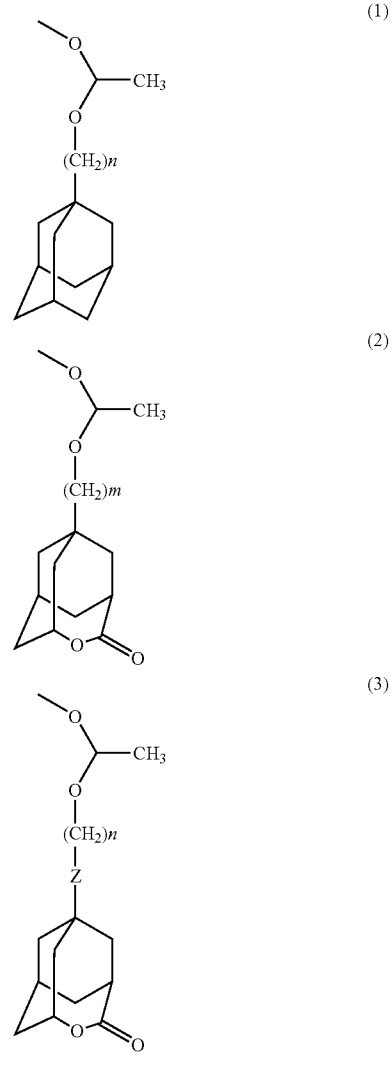

In the general formula (1), n represents an integer of 1 or more; in the general formula (2) m represents an integer of 0 or more; and in the general formula (3), n represents an integer of 1 or more, and Z represents one of groups represented by the following chemical formula (1)

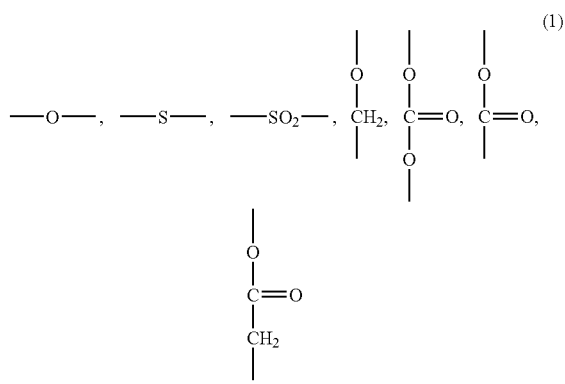

As having been described, a protecting group used in a chemical amplification photoresist tends to contaminate an EB column. It is well known that an acetal group is deprotected with low energy owing to the low activation energy of chemical reaction, i.e., such protecting group having high sensitivity. For example, an alkyl acetal group represented by a 1-ethoxyethyl group is widely known as a protecting group for a photoresist, but the alkyl acetal group has such a problem that it is easily deprotected and vaporized with an acid generated by EB exposure, and contaminates EB column of an EB writing apparatus. Furthermore, the protecting group itself has no etching resistance, and thus there is a problem that the photoresist, which have alkyl protecting group, has a poor etching durability.

Even in an alicyclic protecting group, almost same protection ratio (about 20-30%) is needed as alkyl protecting group in order to obtain a solubility contrast between unexposed area and exposed area. In the case where the alicyclic protecting group is used for protecting group, a phase separation problem tends to occur after coating, and often causes an increase of line edge roughness since the developer solution does not penetrate homogeneously. It is supposed that these problems caused by the great difference in the polarity of alicyclic group and hydroxy group in the photoresist polymer.

Therefore, the protecting groups that are already disclosed, e.g., the alkyl acetal group and the adamantyl acetal group, are insufficient for a resist material that can be adapted to the next generation lithography.

Under the circumstances, the inventors have made earnest investigations for solving the problems, and as a result, it has been found that the problems can be solved by the embodiment having the aforementioned constitution.

In the case where the resin component is protected with at least one of the alicyclic acetal groups represented by the general formulae (1) to (3), high etching resistance can be obtained, and when the protecting group is deprotected with an acid generated by EB exposure, the deprotected protecting group is difficultly vaporized owing to the large molecular weight thereof, whereby a EB column can be free from being contaminated to some extent. Furthermore, we found that the protecting ratio of the hydroxy group in the alkali soluble resin can be reduced in comparison to the conventional protecting groups which are already known, and thus such a photoresist having high sensitivity can be obtained that is free of such problems as line edge roughness and phase separation, and can prevent contamination of an EB column. It is considered that this is because the alicyclic part (adamantane derivative) can move flexibly owing to the group $(CH_2)_n$ (wherein n represents an integer of 1 or more) present between the alicyclic part and the oxygen atom, whereby a large mutual interaction can be obtained with the adjacent —OH group to improve the inhibition effect of the protecting group.

The adamantane derivatives in the general formulae (2) and (3) have a lactone structure in the adamantly ring in the molecule thereof, and have much higher hydrophilicity than the protecting group having no lactone structure. Therefore, the combination of these protecting groups can control the hydrophilicity of the polymer material (resin), which gives a great influence on the developing properties. Accordingly, the composition can be adapted to developer solutions having various alkali concentrations. Furthermore, this adamantyl derivative group (an adamantane ring having a lactonyl group inside), having hydrophilicity, has an intermediate nature (polarity) between the protecting group solely having an adamantane structure (strong hydrophobicity) and a —OH group in alkali soluble resin (hydrophilicity), whereby penetration of an alkaline developer into the resin upon developing is carried out homogeneously, whereby such an effect can be obtained that a line edge roughness is reduced.

In the positive photosensitive composition of the invention, hydroxyl groups of the alkali soluble resin are preferably protected with at least one of the groups represented by the general formulae (1) to (3) in an amount of about 4% or more. In the case where the protected amount is about 4% or more, insolubility to an alkali developer solution can be easily controlled.

The polymer material in the embodiment may have other protecting groups in addition to the protecting groups represented by the general formulae (1) to (3). Specific examples of the other protecting groups include groups represented by the following general formulae (4) to (10). The polymer material may have one or plural groups selected therefrom.

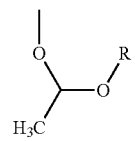

(4)

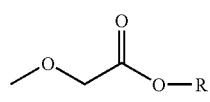

(5)

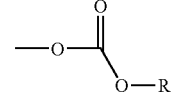

(6)

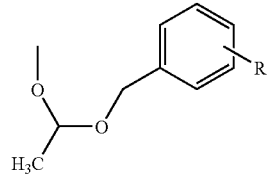

(7)

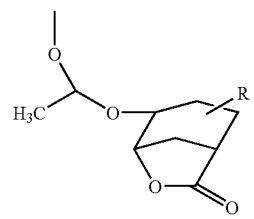

(8)

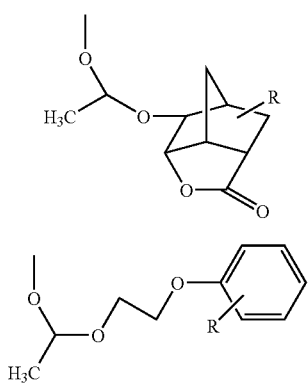

wherein R represents a hydrogen atom or an alkyl group having from 1 to 4 carbon atoms.

In the molecular structures of the groups represented by the general formulae (1) to (3) in the embodiment, the tertiary carbon atom of adamantane or the adamantane derivative (an adamantane ring having a lactonyl group inside) has the bond toward the alkali soluble group, and the equivalent effect can also be obtained in the case where the secondary carbon atom thereof has the bond.

As the alkali soluble resin, to which the protecting group is attached, in the embodiment, a polymer having a phenol derivative, or having an alicyclic structure in the polymer backbone, and having a weight average molecular weight of from 1,000 to 50,000 is used. Examples thereof include a phenol novolak resin, a xylenol novolak resin, a vinylphenol resin, a cresol novolak resin, a copolymer of vinylphenol and an acrylic resin, a norbornene resin having, as a substituent, ethanol substituted by a trifluoromethyl group, and a copolymer of the norbornene resin and an acrylic resin. The alkali soluble resin preferably has a narrow molecular weight distribution. Specifically, the alkali soluble resin preferably has a Mw/Mn (Mw: weight average molecular weight, Mn: number average molecular weight) of 1.2 or less, but the invention is not limited to the value.

The protecting group can be introduced by an acid catalyst reaction of a vinylether compound having the adamantane derivative groups represented by the general formulae (1) to (3) as a raw material and a phenolic hydroxyl group. An acid used as the catalyst may be appropriately selected from inorganic acids and organic acids. For example, polyhydroxystyrene and vinylether are dissolved in such an amount of ethyl acetate that is 10 times the amount of polyhydroxystyrene, to which dichloroacetic acid as an acid catalyst is added thereto in an amount, for example, of 5% by weight based on the amount of the polyhydroxystyrene, and the mixture is stirred at room temperature for about 12 hours. After neutralizing with an alkali, the reaction mixture is repeatedly washed with water and then added dropwise to hexane to reprecipitate a polymer in a powder form. In the case where a strong acid is used, there is such a tendency that vinylether is polymerized by itself to fail to obtain the target polymer.

As the acid generator used in the embodiment, compounds that are ordinarily used in the photoresist material may be used.

Examples thereof include an onium salt, a sulfonyl compound, a sulfonate ester and an organic halide. Examples of the onium salt include a diazonium salt, a sulfonium salt and an iodonium salt, with a counter anion, such as $CF_3SO_3^-$ and $p\text{-}CH_3PhSO_3^-$, and more particularly preferred examples thereof include a triallylsulfonium salt and a diallyliodonium salt. The onium salt has been known as an acid generator having good sensitivity to irradiation of an ionic radiation. Specific examples thereof include a trifluoroacetate salt a trifluoromethanesulfonate salt and a toluenesulfonate salt of diphenyliodonium, 4,4'-dibutylphenyliodonium and triphenylsulfonium, and specifically, diphenyliodonium trifluoromethanesulfonate, di(p-tert-butyl)phenyliodonium trifluoromethanesulfonate, triphenylsulfonium trifluoromethanesulfonate and the like.

The sulfonyl compound is a compound generating sulfonic acid upon irradiation of an ionic radiation, and examples thereof include those disclosed in U.S. Pat. No. 5,348,838. Specific examples thereof include phenylsulfonylaectonitrile, bisphenylsulfonylmethane and triphenylsulfonylmethane.

Examples of the sulfonate ester include nitrobenzyl-p-toluenesulfonate.

The organic halide is a compound forming a hydroacid halide, and examples thereof include those disclosed in U.S. Pat. Nos. 3,515,552 and 3,536,489. Specific examples thereof include 2,4,6-trichloromethyltriazine.

The mixing amount of the acid generator is preferably from 0.1 to 20% by weight, and more preferably from 0.2 to 10% by weight, based on the total weight of the solid content of the photosensitive composition.

A basic compound may be added to the composition to improve the resolution. Examples of the basic compound include trimethylamine, hexylamine, heptylamine, octylamine, nonylamine, decylamine, stearylamine, aniline, 2-methylaniline, 3-methylaniline, 4-methylaniline, 4-nitroaniline, 1- or 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, trimethylamine, tripropylamine, tributylamine, tripentylamine, trihexylamine, triheptylamine, trioctylamine, trinonylamine, tridecylamine, triethanolamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyodiheptylamine, ethyldioctylamine, ethyldinonylamine, ethyldidecylamine, dicyclohexylmethylamine, tris(2-(2-methoxyethoxy)ethyl)amine, triisopropanolamine, N,N-dimethylaniline, 2,6-isopropylaniline, imidazole, 2-phenylimidazole, pyridine, 4-methylpyridine, 4-phenylpyridine, benzylpyridine, 3-aminopyrrolidine, 4-methylimidazole, bipyridine, 2,2'-dipyridylamine, di-2-pyridylketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, guanidine, 2-aminopyridine, 3-aminopyridine, 4-aminopyridine, 1,1-dimethylguanidine, choline, N-methylpyrrolidone, dimethylimidazole, indoline, piperazine and pyrimidine.

The composition may contain such a tertiary alcohol compound that functions as a water generating agent generating water with the acid catalyst. Examples thereof include pinacol, cyclohexanol, 2,4-dimethyl-2,4-pentanediol, 2,5-dimethyl-2,5-hexanediol, 2-methyl-2-butanol, 3-methyl-1,3-butanediol, 2,3-dimethyl-2-butanol, 2-methyl-2-pentanol, 3-methyl-3-pentanol, 2,3-dimethyl-3-pentanol, 3-ethyl-3-pentanol, 2-methyl-2,4-pentanediol, 2-methyl-2-hexanol, 3-methyl-3-hexanol, 1-methylcyclohexanol, 2-methyl-2- heptanol, 2,5-dimethyl-2,5-hexanediol, 2,3-dimethyl-2-hexanol, 2,5-dimethyl-2-hexanol, 3,4-dimethyl-3-hexanol, 3,5-dimethyl-3-hexanol, 2-phenyl-2-propanol, 3-ethyl-2,2-dimethyl-3-pentanol, 2-methyl-1-phenyl-2-propanol, 2-phenyl-2-butanol, 1-adamantanol, menthane-3,8-diol, menthane(6)-2,8-diol, 3,7-dimethyl-3-octanol, 2-methyl-2-adamantanol, 3-methyl-2-phenyl-2,3-butanediol, 1,1-diphenylethanol, 1,2-diphenyl-2-propanol and benzopinacol.

The ultraviolet ray herein includes the g line (wavelength: 436 nm), the h line (405 nm) and the i line (365 nm), and KrF excimer laser light, ArF excimer laser light and F2 excimer laser light, Extreme Ultraviolet light (EUV) and the ionic radiation herein includes an electron beam, a β-ray, a γ-ray, an X-ray and neutron radiation.

The photosensitive composition of the embodiment can be produced by dissolving the aforementioned components including the resin component and the acid generator in an organic solvent. An ordinary organic solvent can be used for dissolving the photoresist materials. Examples thereof include cyclohexanone, acetone, methyl ethyl ketone, methyl isobutyl ketone, methylcellosolve, methylcellosolve acetate, ethylcellosolve acetate, butylcellosolve acetate, methoxymethylpropionic acid, propylene glycol monomethylether acetate, ethyl lactate, ethyl acetate, butyl acetate, isoamyl acetate, γ-butyrolactone, dimethylsulfoxide, dimethylformamide and N-methylpyrrolidone. The organic solvent may be used solely or as a mixture of two or more kinds of them.

The method for forming a pattern using the photosensitive composition of the embodiment will be described. Varnish of the resist dissolved in an organic solvent as described above is coated on a substrate by a spin coating method, a dip coating method or the like, and dried at a temperature of 150° C. or less, preferably from 70 to 120° C., to form a resist film. Examples of the substrate include a silicon wafer, a silicon wafer having various insulating layer, electrodes and wiring formed on the surface thereof, a wafer of a III to V Group compound semiconductor, such as GaAs and AlGaAs, a quartz substrate having chromium or chromium oxide vapor-deposited thereon, an aluminum vapor-deposited substrate, a BPSG-coated substrate, a PSG-coated substrate, a BSG-coated substrate, an SOG-coated substrate and a carbon film-sputtered substrate.

The resist film is then irradiated with an ultraviolet ray or an ionic radiation through a mask pattern having a shape corresponding to the target pattern, or is directly scanning on the surface thereof with an ultraviolet ray or an ionic radiation, so as to expose the resist film.

The resist film thus exposed is baked at a temperature of about 170° C. or less by heating on a hot plate or in an oven, by infrared ray irradiation or the like. Thereafter, the resist film is developed by a dipping method, a spray method or the like to dissolve and remove the exposed part or the non-exposed part selectively in an alkali solution, whereby the target pattern is formed. Specific examples of the alkali solution include an organic alkali aqueous solution, such as a tetramethylammonium hydroxide aqueous solution and a choline aqueous solution, an inorganic alkali aqueous solution, such as a potassium hydroxide aqueous solution and a sodium hydroxide aqueous solution, a solution obtained by adding an alcohol and a surfactant to the aqueous solutions. The concentration of the alkali solution is preferably 15% by weight or less for obtaining a sufficient difference in dissolution rate between the exposed part and the non-exposed part.

The resist pattern thus formed by using the photosensitive composition of the embodiment has the aforementioned favorable characteristics.

Other steps than those described above may be added to the method of the invention, and examples of the steps that may be added include a step of forming a flattening layer as an underlayer of the resist film, a pretreating step for improving adhesion between the resist film and the underlayer, a rinsing step of removing the developer solution with water after developing the resist film, and a reirradiating step with an ultraviolet ray before dry etching.

The invention will be described in more detail below with reference to Examples and Comparative Examples, but the invention is not construed as being limited thereto.

EXAMPLE

Example 1

100 parts by weight of a resin obtained by protecting 10% of hydroxyl groups of polyhydroxystyrene having a weight average molecular weight of 10,000 with a 1-adamantanemethyloxy-ethyl group, 5 parts by weight of naphtylimidyl-camphor sulfonate as an acid generator, and 20% by mole of tributylamine based on the acid generator were dissolved in methyl 3-methoxypropionate as a solvent to prepare a resist solution. The resist solution was coated on a Si wafer and exposed to an L/S pattern by using an electron beam exposing apparatus at an exposure dose of 5 μC/cm$^2$ (50 KeV). After the exposure, the resist film was baked at 100° C. for 3 minutes and developed with a 0.21 N TMAH aqueous solution for 60 seconds. Thus, the exposed part of the resist film was selectively dissolved and removed to form a positive pattern.

Example 2

100 parts by weight of a resin obtained by protecting 13% of hydroxyl groups of polyhydroxystyrene having a weight average molecular weight of 8,000 with a 1-adamantaneoxymethyloxy-ethyl group having a lactone group introduced thereto, 5 parts by weight of naphtylimidylcamphor sulfonate as an acid generator, and 20% by mole of tributylamine based on the acid generator were dissolved in methyl 3-methoxypropionate as a solvent to prepare a resist solution. The resist solution was coated on a Si wafer and exposed by using an electron beam exposing apparatus at an irradiance of 5 μC/cm$^2$ (50 KeV) to form the same pattern as in Example 1. After the exposure, the resist film was baked at 100° C. for 3 minutes and developed with a 0.13 N TMAH aqueous solution for 60 seconds. Thus, the exposed part of the resist film was selectively dissolved and removed to form a positive pattern.

Example 3

100 parts by weight of a resin obtained by protecting 10% of hydroxyl groups of polyhydroxystyrene having a weight average molecular weight of 5,000 with a 1-adamantaneethyloxy-ethyl group, 5 parts by weight of naphtylimidylcamphor sulfonate as an acid generator, and 20% by mole of tributylamine based on the acid generator were dissolved in methyl 3-methoxypropionate as a solvent to prepare a resist solution. The resist solution was coated on a Si wafer and exposed by using an electron beam exposing apparatus at an irradiance of 5.5 μC/cm$^2$ (50 KeV) to form the same pattern as in Example 1. After the exposure, the resist film was baked at 100° C. for 3 minutes and developed with a 0.15 N TMAH aqueous solution for 60 seconds. Thus, the exposed part of the resist film was selectively dissolved and removed to form a positive pattern.

Example 4

100 parts by weight of a resin obtained by protecting 19% of hydroxyl groups of polyhydroxystyrene having a weight average molecular weight of 5,000 with a 1-adamantaneoxy-ethyl group having a lactone group introduced thereto, 5 parts by weight of naphtylimidylcamphor sulfonate as an acid generator, and 20% by mole of tributylamine based on the acid generator were dissolved in methyl 3-methoxypropionate as a solvent to prepare a resist solution. The resist solution was coated on a Si wafer and exposed by using an electron beam exposing apparatus at an irradiance of 5 µC/cm$^2$ (50 KeV) to form the same pattern as in Example 1. After the exposure, the resist film was baked at 100° C. for 3 minutes and developed with a 0.13 N TMAH aqueous solution for 20 seconds. Thus, the exposed part of the resist film was selectively dissolved and removed to form a positive pattern.

Example 5

100 parts by weight of a resin obtained by protecting 11% of hydroxyl groups of polyhydroxystyrene having a weight average molecular weight of 5,000 with a 1-adamantaneoxy-ethyl group having a lactone group introduced thereto and protecting 6% of hydroxyl groups thereof with a 1-adamantaneethyloxy-ethyl group, 5 parts by weight of naphtylimidylcamphor sulfonate as an acid generator, and 20% by mole of tributylamine based on the acid generator were dissolved in methyl 3-methoxypropionate as a solvent to prepare a resist solution. The resist solution was coated on a Si wafer and exposed by using an electron beam exposing apparatus at an irradiance of 5.5 µC/cm$^2$ (50 KeV) to form the same pattern as in Example 1. After the exposure, the resist film was baked at 100° C. for 3 minutes and developed with a 0.13 N TMAH aqueous solution for 60 seconds. Thus, the exposed part of the resist film was selectively dissolved and removed to form a positive pattern.

Example 6

100 parts by weight of a resin obtained by protecting 5% of hydroxyl groups of polyhydroxystyrene having a weight average molecular weight of 5,000 with a 1-adamantaneoxy-ethyl group having a lactone group introduced thereto and protecting 10% of hydroxyl groups thereof with a 1-adamantaneethyloxy-ethyl group, 5 parts by weight of naphtylimidylcamphor sulfonate as an acid generator, and 20% by mole of tributylamine based on the acid generator were dissolved in methyl 3-methoxypropionate as a solvent to prepare a resist solution. The resist solution was coated on a Si wafer and exposed by using an electron beam exposing apparatus at an irradiance of 6.5 µC/cm$^2$ (50 KeV) to form the same pattern as in Example 1. After the exposure, the resist film was baked at 100° C. for 3 minutes and developed with a 0.16 N TMAH aqueous solution for 60 seconds. Thus, the exposed part of the resist film was selectively dissolved and removed to form a positive pattern.

Example 7

100 parts by weight of a resin obtained by protecting 4% of hydroxyl groups of polyhydroxystyrene having a weight average molecular weight of 5,000 with a 1-adamantaneoxy-ethyl group having a lactone group introduced thereto and protecting 7% of hydroxyl groups thereof with a 1-adamantaneethyloxy-ethyl group, 5 parts by weight of naphtylimidylcamphor sulfonate as an acid generator, and 20% by mole of tributylamine based on the acid generator were dissolved in methyl 3-methoxypropionate as a solvent to prepare a resist solution. The resist solution was coated on a Si wafer and exposed by using an electron beam exposing apparatus at an irradiance of 5 µC/cm$^2$ (50 KeV) to form the same pattern as in Example 1. After the exposure, the resist film was baked at 100° C. for 3 minutes and developed with a 0.13 N TMAH aqueous solution for 20 seconds. Thus, the exposed part of the resist film was selectively dissolved and removed to form a positive pattern.

Example 8

100 parts by weight of a resin obtained by protecting 11% of hydroxyl groups of polyhydroxystyrene having a weight average molecular weight of 5,000 with a 1-adamantaneoxy-ethyl group having a lactone group introduced thereto and protecting 8% of hydroxyl groups thereof with a 1-adamantaneethyloxy-ethyl group, 5 parts by weight of naphtylimidylcamphor sulfonate as an acid generator, and 20% by mole of tributylamine based on the acid generator were dissolved in methyl 3-methoxypropionate as a solvent to prepare a resist solution. The resist solution was coated on a Si wafer and exposed by using an electron beam exposing apparatus at an irradiance of 5 µC/cm$^2$ (50 KeV) to form the same pattern as in Example 1. After the exposure, the resist film was baked at 100° C. for 3 minutes and developed with a 0.16 N TMAH aqueous solution for 60 seconds. Thus, the exposed part of the resist film was selectively dissolved and removed to form a positive pattern.

Comparative Example 1

100 parts by weight of a resin obtained by protecting 30% of hydroxyl groups of polyhydroxystyrene having a weight average molecular weight of 10,000 with a 1-ethoxy-ethyl group, 5 parts by weight of naphtylimidylcamphor sulfonate as an acid generator, and 20% by mole of tributylamine based on the acid generator were dissolved in methyl 3-methoxypropionate as a solvent to prepare a resist solution. The resist solution was coated on a Si wafer and exposed by using an electron beam exposing apparatus at an irradiance of 5 µC/cm$^2$ (50 KeV) to form the same pattern as in Example 1. After the exposure, the resist film was baked at 100° C. for 3 minutes and developed with a 0.21 N TMAH aqueous solution for 60 seconds. Thus, the exposed part of the resist film was selectively dissolved and removed to form a positive pattern.

Comparative Example 2

100 parts by weight of a resin obtained by protecting 23% of hydroxyl groups of polyhydroxystyrene having a weight average molecular weight of 10,000 with a 1-adamantyloxy-ethyl group, 5 parts by weight of naphtylimidylcamphor sulfonate as an acid generator, and 20% by mole of tributylamine based on the acid generator were dissolved in methyl 3-methoxypropionate as a solvent to prepare a resist solution. The resist solution was coated on a Si wafer and exposed by using an electron beam exposing apparatus at an irradiance of 5.5 µC/cm$^2$ (50 KeV) to form the same pattern as in Example 1. After the exposure, the resist film was baked at 100° C. for 3 minutes and developed with a 0.21 N TMAH aqueous solution for 60 seconds. Thus, the exposed part of the resist film was selectively dissolved and removed to form a positive pattern.

Examples 1 to 8 and Comparative Examples 1 and 2 were evaluated for sensitivity, presence of a latent image (evaporation after exposure without baking), line edge roughness, resolution and etching resistance. The results obtained are shown in Table 1 below.

TABLE 1

| | Sensitivity | Presence of latent image | Edge roughness | Resolution (nm) | Etching resistance |
|---|---|---|---|---|---|
| Example 1 | good | none | slight | 50 | good |
| Example 2 | good | none | slight | 50 | good |
| Example 3 | good | none | slight | 50 | good |
| Example 4 | good | none | slight | 50 | good |
| Example 5 | good | none | slight | 50 | good |
| Example 6 | good | none | slight | 50 | good |
| Example 7 | good | none | slight | 50 | good |
| Example 8 | good | none | slight | 50 | good |
| Comparative Example 1 | good | found | small | 70 | poor |
| Comparative Example 2 | good | none | large | 80 | good |

As shown in Table 1, in Examples 1 to 8, the protecting group was not vaporized upon exposure, and good etching resistance was obtained. In Examples 1 and 3, a high inhibition effect of the protecting group was observed with the protecting group having high hydrophobicity. Thus, the introducing amount of the protecting group could be suppressed to 10%, and a resolution of 50 nm L/S could be obtained. The edge roughness was also considerably small. In Examples 2 and 4, the introducing amount of the protecting group was necessarily larger than Examples 1 and 3 since a hydrophilic part (lactonyl group) was introduced to the protecting group. However, it was observed that the roughness was considerably small, and a resolution of 50 nm could be obtained, as similar to Examples 1 and 3.

In Examples 5 to 8, a material having both a hydrophilic protecting group and a hydrophobic protecting group was used. As understood from Examples 5 to 8, the photoresist materials could be adapted to developer solutions having various alkali concentrations by using two kind of protecting group. The roughness was considerably small, and a resolution of 50 nm could be obtained, as similar to Examples 1 to 4.

In the case where an alkyl acetal group was used as in Comparative Example 1, on the other hand, a patterned latent image was confirmed after EB exposure without baking, which indicated that the acetal group was released and decomposed during EB writing and vaporized into EB column. Furthermore, the protecting group was necessarily introduced in an amount of about 30% due to the low inhibition effect for the developer. Therefore, it was found that larger roughness occurred in comparison to Examples 1 to 8. The resolution was as low as 70 nm. In addition, the etching rate was large due to the alkyl group in the protecting group, whereby the margin of etching selectivity was inferior to Examples.

In Comparative Example 2, in which a protecting group having a 1-adamantane-ethyl group was introduced, no patterned latent image was found, which indicated that the protecting group was not valorized. The protecting group having an adamantane group provided a low etching rate, which brought about etching resistance equivalent to Examples 1 to 8. However, the protecting group was necessarily introduced in an amount of about 23% in spite of their strong hydrophobicity, whereby deterioration in pattern shape (large edge roughness) was found, which was likely caused by inhomogeneous penetration of the developer solution, and the resolution was as low as 80 nm in the EB writing operation under the same conditions.

What is claimed is:

1. A method for forming a pattern, comprising:
   forming a photosensitive layer comprising a photosensitive composition on a substrate;
   selectively irradiating the photosensitive layer with at least one of an ultraviolet ray and an ionizing radiation;
   subjecting the substrate to a heat treatment; and
   developing the photosensitive layer to remove selectively an irradiated area of the photosensitive layer after the heat treatment;
   wherein photosensitive composition comprises:
   a polymer material comprising a group having a structure represented by following general formula (1);

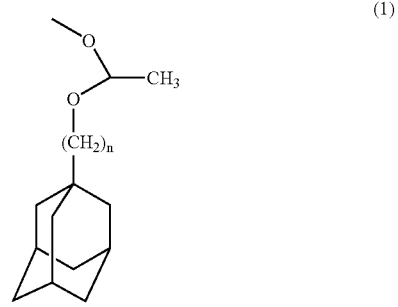

(1)

wherein n represents an integer of 1 or more a polymer material comprising an alkali soluble resin having hydroxyl groups protected with a group represented by the general formula (2) in an amount of 4% or more;

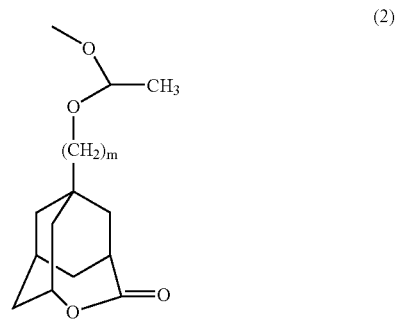

(2)

and
a photo acid generator generating an acid with at least one of an ultraviolet ray and an ionizing radiation.

2. The method according to claim 1, wherein the alkali soluble resin has at least one of a phenol skeleton and an alicyclic skeleton.

3. The method according to claim 1, wherein the alkali soluble resin has a weight average molecular weight of from 1,000 to 50,000, and has Mw/Mn of 1.2 or less,
   wherein
   Mw represents a weight average molecular weight; and
   Mn represents a number average molecular weight.

* * * * *